United States Patent
Chandolu et al.

(10) Patent No.: US 11,043,412 B2
(45) Date of Patent: Jun. 22, 2021

(54) METHODS OF FORMING MICROELECTRONIC DEVICES, AND RELATED MICROELECTRONIC DEVICES AND ELECTRONIC SYSTEMS

(71) Applicant: Micron Technology, Inc., Boise, ID (US)

(72) Inventors: Anilkumar Chandolu, Boise, ID (US); Christopher R. Ritchie, Boise, ID (US); Darwin A. Clampitt, Wilder, ID (US); S M Istiaque Hossain, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 61 days.

(21) Appl. No.: 16/532,035

(22) Filed: Aug. 5, 2019

(65) Prior Publication Data
US 2021/0043504 A1    Feb. 11, 2021

(51) Int. Cl.
| | | |
|---|---|---|
| H01L 21/76 | (2006.01) |
| H01L 27/11 | (2006.01) |
| H01L 21/768 | (2006.01) |
| H01L 27/11582 | (2017.01) |
| H01L 27/11556 | (2017.01) |

(52) U.S. Cl.
CPC .. *H01L 21/76837* (2013.01); *H01L 27/11556* (2013.01); *H01L 27/11582* (2013.01)

(58) Field of Classification Search
CPC ......... H01L 27/11582; H01L 23/53257; H01L 27/11573; H01L 27/11556; H01L 23/528; H01L 27/11526; H01L 23/532; H01L 21/76837; H01L 29/42344; H01L 29/42328; H01L 27/1157; H01L 29/66825; H01L 27/11578; H01L 21/762; H01L 29/7926
USPC ....................................................... 257/314
See application file for complete search history.

(56) References Cited

U.S. PATENT DOCUMENTS

| | | | | |
|---|---|---|---|---|
| 10,700,089 B1* | 6/2020 | Hojo | ................. | H01L 27/11575 |
| 2010/0258852 A1* | 10/2010 | Lim | .................. | H01L 27/11578 |
| | | | | 257/324 |
| 2011/0291172 A1* | 12/2011 | Hwang | ............. | H01L 27/11582 |
| | | | | 257/314 |
| 2011/0316064 A1* | 12/2011 | Kim | .................... | H01L 29/7926 |
| | | | | 257/314 |
| 2012/0012921 A1* | 1/2012 | Liu | ..................... | H01L 27/1157 |
| | | | | 257/326 |

(Continued)

*Primary Examiner* — Didarul A Mazumder
(74) *Attorney, Agent, or Firm* — TraskBritt

(57) ABSTRACT

A method of forming a microelectronic device comprises forming a stack structure comprising vertically alternating insulating structures and additional insulating structures arranged in tiers. Each of the tiers individually comprises one of the insulating structures and one of the additional insulating structures. A first trench is formed to partially vertically extend through the stack structure. The first trench comprises a first portion having a first width, and a second portion at a horizontal boundary of the first portion and having a second width greater than the first width. A dielectric structure is formed within the first trench. The dielectric structure comprises a substantially void-free section proximate the horizontal boundary of the first portion of the trench. Microelectronic devices and electronic systems are also described.

11 Claims, 12 Drawing Sheets

(56) References Cited

U.S. PATENT DOCUMENTS

| | | | |
|---|---|---|---|
| 2012/0135583 A1* | 5/2012 | Jang | H01L 21/762 438/433 |
| 2012/0205722 A1* | 8/2012 | Lee | H01L 27/11578 257/211 |
| 2014/0131784 A1* | 5/2014 | Davis | H01L 29/66825 257/316 |
| 2014/0191306 A1* | 7/2014 | Hopkins | H01L 29/42344 257/315 |
| 2015/0325589 A1* | 11/2015 | Hopkins | H01L 29/42328 438/257 |
| 2016/0071878 A1* | 3/2016 | Davis | H01L 27/1157 438/257 |
| 2017/0133389 A1* | 5/2017 | Yun | H01L 27/1157 |
| 2017/0148808 A1* | 5/2017 | Nishikawa | H01L 27/11582 |
| 2019/0214395 A1* | 7/2019 | Zhang | H01L 27/11573 |

* cited by examiner

METHODS OF FORMING MICROELECTRONIC DEVICES, AND RELATED MICROELECTRONIC DEVICES AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more conductive stack structures including tiers of conductive structures and insulative structures. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the conductive stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the conductive stack structure(s) of the memory device. The staircase structure includes individual "steps" defining contact regions of the conductive structures, upon which conductive contact structures can be positioned to provide electrical access to the conductive structures.

Unfortunately, as feature packing densities have increased and margins for formation errors have decreased, conventional methods of forming memory devices (e.g., NAND Flash memory devices) have resulted in undesirable current leaks (e.g., access line to source plate current leaks) and short circuits that can diminish desired memory device performance, reliability, and durability. For example, conventional methods of partitioning a preliminary stack structure including tiers of insulative structures and additional insulating structures into blocks each including two of more sub-blocks may result in undesirable conductive material depositions during subsequent processing of the preliminary stack structure (e.g., so called "replace gate" or "gate last" processing of the preliminary stack structure to replace one or more portions of the additional insulating structures with conductive structures to form the conductive stack structure of a memory device) that can effectuate undesirable leakage currents and short circuits.

In view of the foregoing, there remains a need for new methods of forming microelectronic devices (e.g., memory devices, such as 3D NAND Flash memory devices) alleviating the problems of conventional methods of forming microelectronic devices, as well as for new microelectronic device configurations resulting from the new methods, and new electronic systems including the new microelectronic device configurations.

DETAILED DESCRIPTION

Figure 1A:
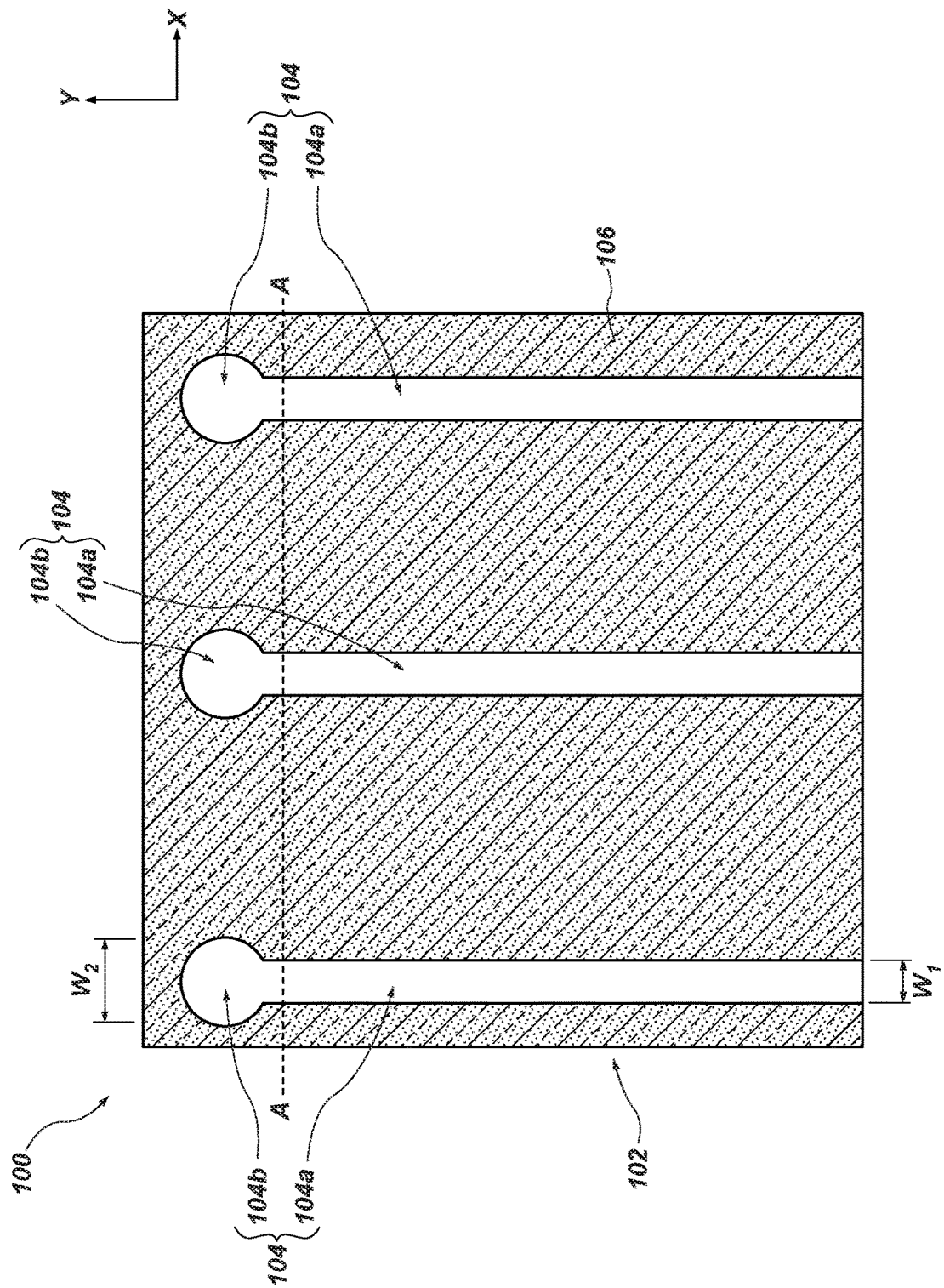
FIGS. 1A through 4B are simplified partial top-down (i.e., FIGS. 1A, 2A, 3A, and 4A) and simplified partial cross-sectional (i.e., FIGS. 1B, 2B, 3B, and 4B) views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting, but not limited to, memory functionality.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, vertically-neighboring" or "longitudinally-neighboring" features (e.g., regions, structures, devices) means and includes features located most vertically proximate vertically closest) one another. In addition, as used herein, "horizontally-neighboring" or "laterally-neighboring" features (e.g., regions, structures, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization, or other known methods.

FIGS. 1A through 4B are simplified partial top-down (i.e., FIGS. 1A, 2A, 3A, and 4A) and simplified partial cross-sectional (i.e., FIGS. 1B, 2B, 3B, and 4B) views illustrating embodiments of a method of forming a microelectronic device structure of a microelectronic device (e.g., a memory device, such as a 3D NAND Flash memory device). With the description provided below, it will be readily apparent to one of ordinary skill in the art that the methods and structures described herein may be used in various devices. In other words, the methods of the disclosure may be used whenever it is desired to form a microelectronic device.

Figure 1B:
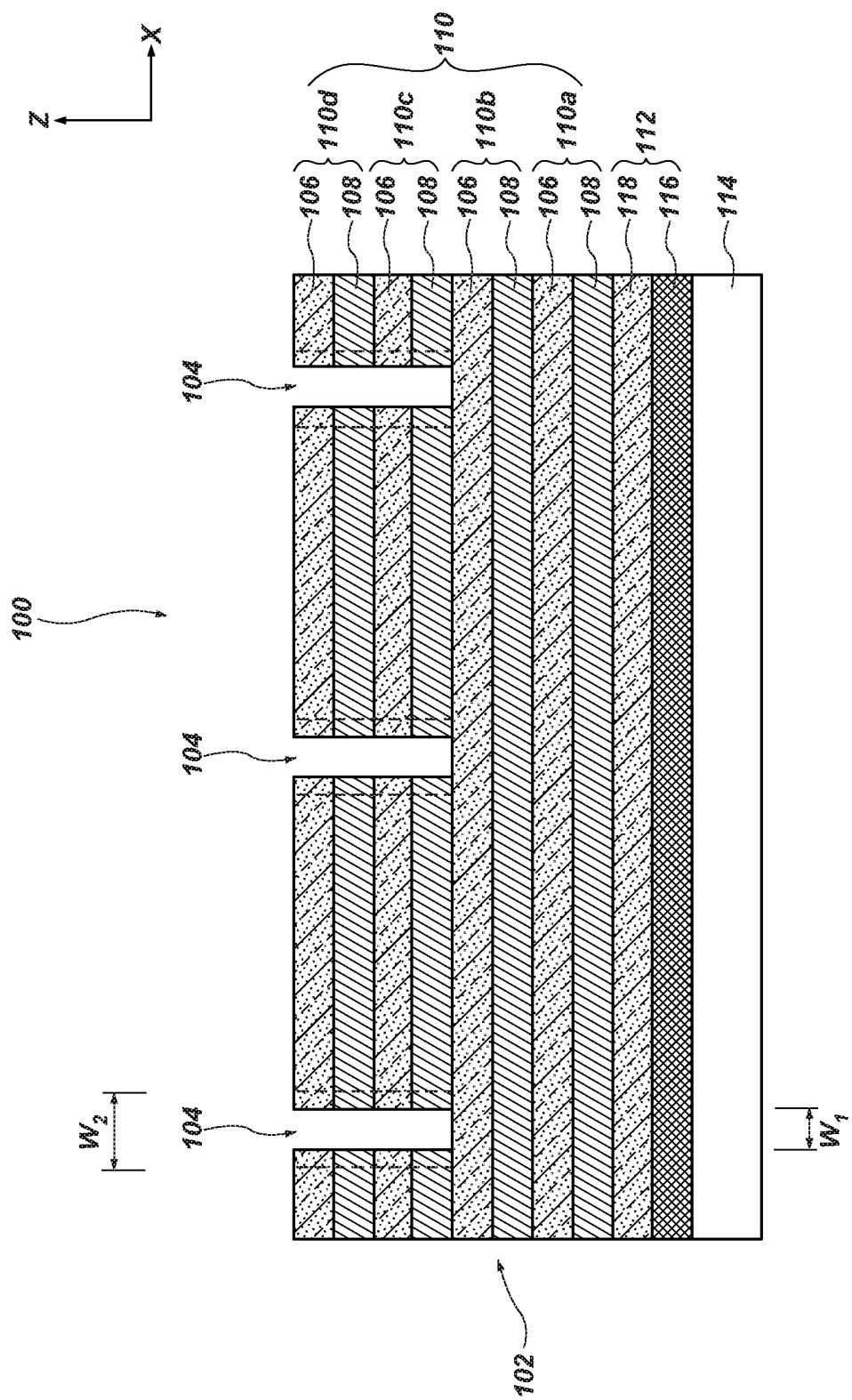

Referring to FIG. 1A, a microelectronic device structure 100 may be formed to include a preliminary stack structure 102, and first trenches 104 (e.g., slots, openings) extending into the preliminary stack structure 102. The preliminary stack structure 102 and the first trenches 104 are described in further detail below, along with additional components (e.g., structures, features) of the microelectronic device structure 100 at the processing stage depicted in FIG. 1A. FIG. 1B is a simplified partial cross-sectional view of the microelectronic device structure 100 about the line A-A shown in FIG. 1A. For clarity and ease of understanding of the drawings and related description, not all features depicted in one of FIGS. 1A and 1B are depicted in the other of FIGS. 1A and 1B.

Referring to FIG. 1B, the preliminary stack structure 102 may be formed to include a vertically alternating (e.g., in the Z-direction) sequence of insulating structures 106 and additional insulating structures 108 arranged in tiers 110. Each of the tiers 110 may include one of the insulating structures 106 and one of the additional insulating structures 108 vertically adjacent the insulating structure 106. For clarity and ease of understanding of the drawings and related description, FIG. 1B shows the preliminary stack structure 102 as including four (4) tiers 110 (e.g., a first tier 110a, a second tier 110b, a third tier 110c, a fourth tier 110d) of the insulating structures 106 and the additional insulating structures 108. However, the preliminary stack structure 102 may include a different number of tiers 110. For example, in additional embodiments, the preliminary stack structure 102 may include greater than four (4) tiers 110 (e.g., greater than or equal to ten (10) tiers 110, greater than or equal to twenty-five (25) tiers 110, greater than or equal to fifty (50) tiers 110, greater than or equal to one hundred (100) tiers 110) of the insulating structures 106 and the additional insulating structures 108, or may include less than four (4) tiers 110 (e.g., less than or equal to three (3) tiers 110) of the insulating structures 106 and the additional insulating structures 108.

The insulating structures 106 may be formed of and include at least one dielectric material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the insulating structures 106 may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. Each of the insulating structures 106 may individually include a substantially homogeneous distribution or a substantially heterogeneous distribution of the at least one dielectric material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. In some embodiments, each of the insulating structures 106 exhibits a substantially homogeneous distribution of dielectric material. In further embodiments, at least one of the insulating structures 106 exhibits a substantially heterogeneous distribution of at least one dielectric material. One or more of the insulating structures 106 may, for example, be formed of and include a stack (e.g., laminate) of at least two different dielectric materials. In some embodiments, each of the insulating structures 106 is formed of and includes silicon dioxide ($SiO_2$). The insulating structures 106 may each be substantially planar, and may each independently exhibit any desired thickness. In addition, each of the insulating structures 106 may be substantially the same (e.g., exhibit substantially the same material composition, material distribution, size, and shape) as one another, or at least one of the insulating structures 106 may be different (e.g., exhibit one or more of a different material composition, a different material distribution, a different size, and a different shape) than at least one other of the insulating structures 106. In some embodiments, each of the insulating structures 106 is substantially the same as each other of the insulating structures 106.

The additional insulating structures 108 may each be formed of and include at least one additional dielectric material that may be selectively removed relative to the dielectric material of the insulating structures 106. The additional dielectric material of the additional insulating structures 108 may be different than the dielectric material of the insulating structures 106, and may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). Each of the additional insulating structures 108 may individually include a substantially homogeneous distribution or a substantially heterogeneous distribution of the at least one additional dielectric material. In some embodiments, each of the additional insulating structures 108 exhibits a substantially homogeneous distribution of the additional dielectric material. In further embodiments, at least one of the additional insulating structures 108 exhibits a substantially heterogeneous distribution of at least one dielectric material. One or more of the additional insulating structures 108 may, for example, be formed of and include a stack (e.g., laminate) of at least two different additional dielectric materials. In some embodiments, each of the additional insulating structures 108 is formed of and includes silicon nitride ($Si_3N_4$). The additional insulating structures 108 may each be substantially planar, and may each independently exhibit any desired thickness. In addition, each of the additional insulating structures 108 may be substantially the same (e.g., exhibit substantially the same material composition, material distribution, size, and shape) as one another, or at least one of the additional insulating structures 108 may be different (e.g., exhibit one or more of a different material composition, a different material distribution, a different size, and a different shape) than at least one other of the additional insulating structures 108. In some embodiments, each of the additional insulating structures 108 is substantially the same as each other of the additional insulating structures 108. The additional insulating structures 108 may serve as sacrificial structures for the subsequent formation of conductive structures, as described in further detail below.

With continued reference to FIG. 1B, the microelectronic device structure 100 may further include a source tier 112 (e.g., a source level) vertically under (e.g., in the Z-direction) the preliminary stack structure 102, and at least one control device 114 vertically under (e.g., in the Z-direction) the source tier 112. The source tier 112 may be vertically interposed between (e.g., in the Z-direction) the preliminary stack structure 102 and the control device 114. As shown in FIG. 1B, the source tier 112 may include at least one source structure 116 (e.g., a source plate; at least one source line, such as a common source line (CSL)), and at least one other insulating structure 118 vertically adjacent (e.g., in the Z-direction) the source structure 116. The other insulating structure 118 may vertically intervene (e.g., in the Z-direction) between the source structure 116 and the preliminary stack structure 102.

The source structure 116 of the source tier 112 may be formed of and include at least one conductive material, such as a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), a conductive metal-containing material (e.g., a conductive metal nitride, a conductive metal silicide, a conductive metal carbide, a conductive metal oxide), or combinations thereof. The source structure 116 may include a substantially homogeneous distribution of the at least one conductive material, or a substantially heterogeneous distribution of the at least one conductive material. Amounts of the material may vary stepwise (e.g., change abruptly), or may vary continuously (e.g., change progressively, such as linearly, parabolically) throughout different portions of the structure. In some embodiments, the source structure 116 exhibits a substantially homogeneous distribution of conductive material. In additional embodiments, the source structure 116 exhibits a substantially heterogeneous distribution of at least one conductive material. The source structure 116 may, for example, be formed of and include a stack of at least two different conductive materials.

The other insulating structure 118 of the source tier 112 may be formed of and include at least one other dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the other insulating structure 118 may substantially the same as a material composition of the insulating structures 106 or the additional insulating structures 108 of the preliminary stack structure 102, or the material composition of the other insulating structure 118 may be different than the material compositions of the insulating structures 106 and the additional insulating structures 108. In some embodiments, a material composition of the other insulating structure 118 is substantially the same as a material composition of the insulating structures 106 of the preliminary stack structure 102. The other insulating structure 118 may include a substantially homogeneous distribution or a substantially heterogeneous distribution of the at least one other dielectric material thereof. In some embodiments, the other insulating structure 118 exhibits a substantially homogeneous distribution of the other dielectric material. In further embodiments, the other insulating structure 118 exhibits a substantially heterogeneous distribution of at least one dielectric material. In some embodiments, the other insulating structure 118 is formed of and includes $SiO_2$.

With continued reference to FIG. 1B, the control device 114 may include devices and circuitry for controlling various operations of other components of the microelectronic device structure 100. By way of non-limiting example, the control device 114 may include one or more (e.g., each) of charge pumps (e.g., $V_{CCP}$ charge pumps, $V_{NEGWL}$ charge pumps, DVC2 charge pumps); delay-locked loop (DLL) circuitry (e.g., ring oscillators); drain supply voltage (Vat') regulators; devices and circuitry for controlling column operations for arrays (e.g., arrays of vertical memory strings) to subsequently be formed within the microelectronic device structure 100, such as one or more (e.g., each) of decoders (e.g., column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices; and devices and circuitry for controlling row operations for arrays (e.g., arrays of vertical memory strings) within memory regions of the microelectronic device structure 100, such as one or more (e.g., each) of decoders (e.g., row decoders), drivers (e.g., word line (WL) drivers), repair circuitry (e.g., row repair circuitry), memory test devices, MUX, ECC devices, and self-refresh/wear leveling devices. In some embodiments, the control device 114 includes CMOS (complementary metal-oxide-semiconductor) circuitry. In such embodiments, the control device 114 may be characterized as having a "CMOS under Array" ("CuA") configuration.

As shown in FIG. 1B, the first trenches 104 may partially (e.g., less than completely) vertically extend (e.g., in the Z-direction) through the preliminary stack structure 102. For example, as shown in FIG. 1B, each of the first trenches 104 may vertically extend through the uppermost (e.g., vertically highest) two (2) tiers 110 (e.g., the fourth tier 110d and the third tier 110c), and may terminate at the next tier 110 thereunder (e.g., the second tier 110b). In additional embodiments, one or more (e.g., each) of the first trenches 104 vertically extend to a different depth within the preliminary stack structure 102. For example, each of the first trenches 104 may only vertically extend through the uppermost tier 110 of the preliminary stack structure 102, or each of the first trenches 104 vertically extend through the uppermost three (3) tiers 110 (e.g., the fourth tier 110d, the third tier 110c, and the second tier 110b). As described in further detail below, the first trenches 104 may be relatively shallow as compared to additional slots to be subsequently formed in the preliminary stack structure 102.

With returned reference to FIG. 1A, each of the first trenches 104 may include a relatively narrower portion 104a, and a relatively wider portion 104b disposed at a horizontal end (e.g., in the Y-direction) of the relatively narrower portion 104a. As shown in FIG. 1A, the relatively narrower portion 104a of each of the first trenches 104 may have a first width $W_1$ (e.g., a first horizontal dimension in the X-direction), and the relatively wider portion 104b of each of the first trenches 104 may have a second width $W_2$ (e.g., a second horizontal dimension in the X-direction) larger than the first width $W_1$ of the relatively narrower portion 104a. The second width $W_2$ may, for example, be within a range of from about 1 percent to about 500 percent (e.g., from about 10 percent to about 250 percent, from about 25 percent to about 125 percent, from about 50 percent to about 100 percent) larger than the first width $W_1$. In addition, the relatively narrower portion 104a of each of the first trenches 104 may exhibit a different shape than the relatively wider portion 104b of each of the first trenches 104. For example, the relatively narrower portion 104a of each first trench 104 may exhibit a rectangular prism shape having a substantially rectangular horizontal cross-sectional shape, and the relatively wider portion 104b of each first trench 104 may exhibit a circular cylinder shape (e.g., a right circular cylinder shape) having a substantially circular horizontal cross-sectional shape. In additional embodiments, one or more of the relatively narrower portion 104a and the relatively wider portion 104b of one or more (e.g., each) of the first trenches 104 exhibits a different shape. For example, the relatively wider portion 104b of one or more (e.g., each) of the first trenches 104 may exhibit a different cylindrical shape, such as an elliptic cylinder shape having a substantially elliptic cross-sectional shape; or a rectangular prism shape having a substantially rectangular horizontal cross-sectional shape. The second width $W_2$ and the shape of the relatively wider portion 104b of each of the first trenches 104 may be selected to inhibit (e.g., prevent) the formation of void spaces (e.g., air gaps) in portions of dielectric structures to be formed in the first trenches 104, as described in further detail below. For example, the second width $W_2$ and the shape of the relatively wider portion 104b of each of the first trenches 104 may prevent the formation of void spaces in the subsequently-formed dielectric structures at and horizontally proximate locations corresponding to the horizontal ends (e.g., horizontal boundaries in the Y-direction) of the relatively narrower portions 104a of the first trenches 104.

The first trenches 104 may be formed in the preliminary stack structure 102 using conventional material removal (e.g., masking and etching) processes, which are not described in detail herein. For example, one or more portions of the preliminary stack structure 102 may be subjected to at least one etching process (e.g., at least one dry etching process, such as one or more of a reactive ion etching (ME) process, a deep ME process, a plasma etching process, a reactive ion beam etching process, and a chemically assisted ion beam etching process; at least one wet etching process, such as one or more of a hydrofluoric acid etching process, a buffered hydrofluoric acid etching process, and a buffered oxide etching process) to form the first trenches 104 in the preliminary stack structure 102.

Figure 2:
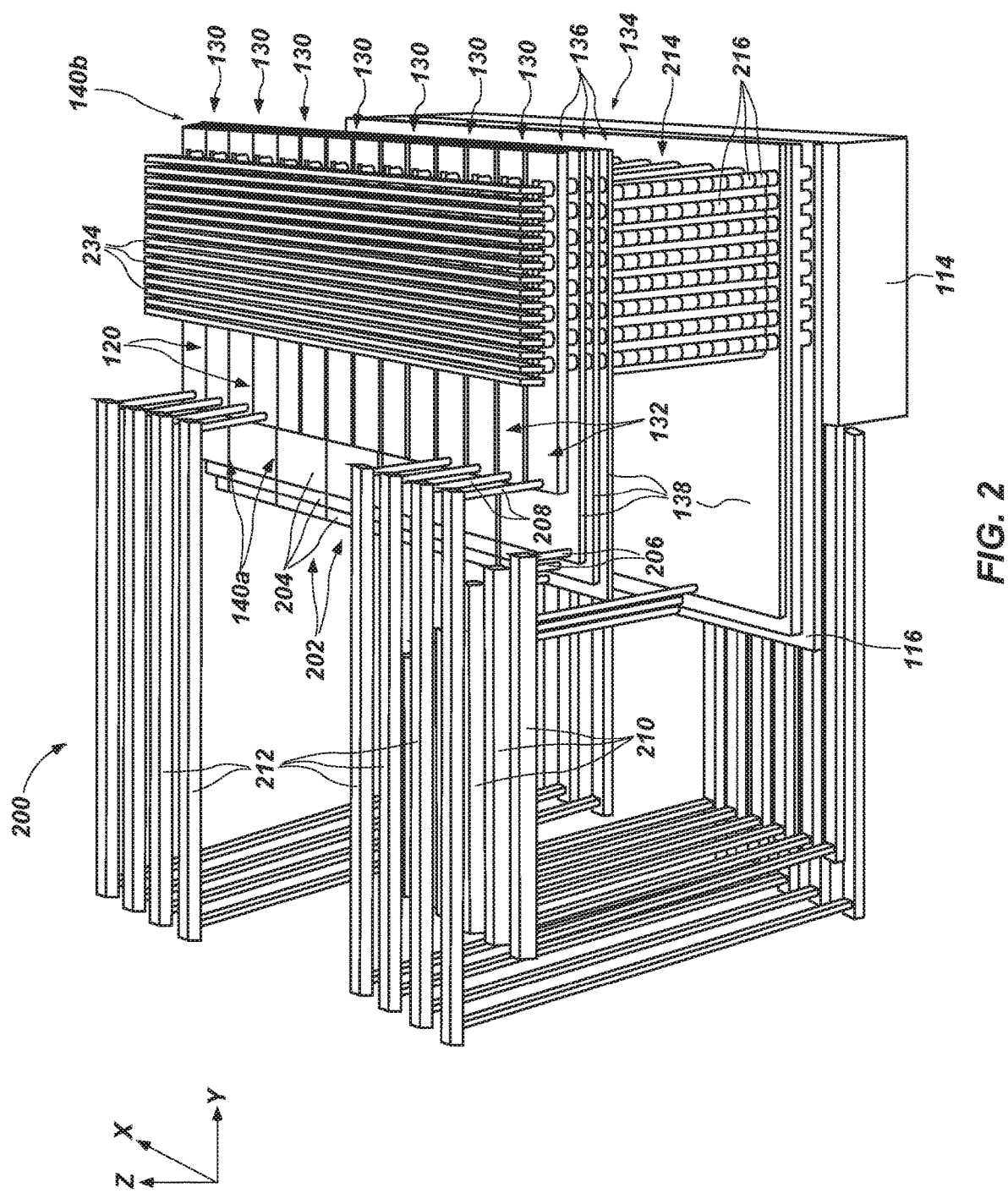
Figure 2A:
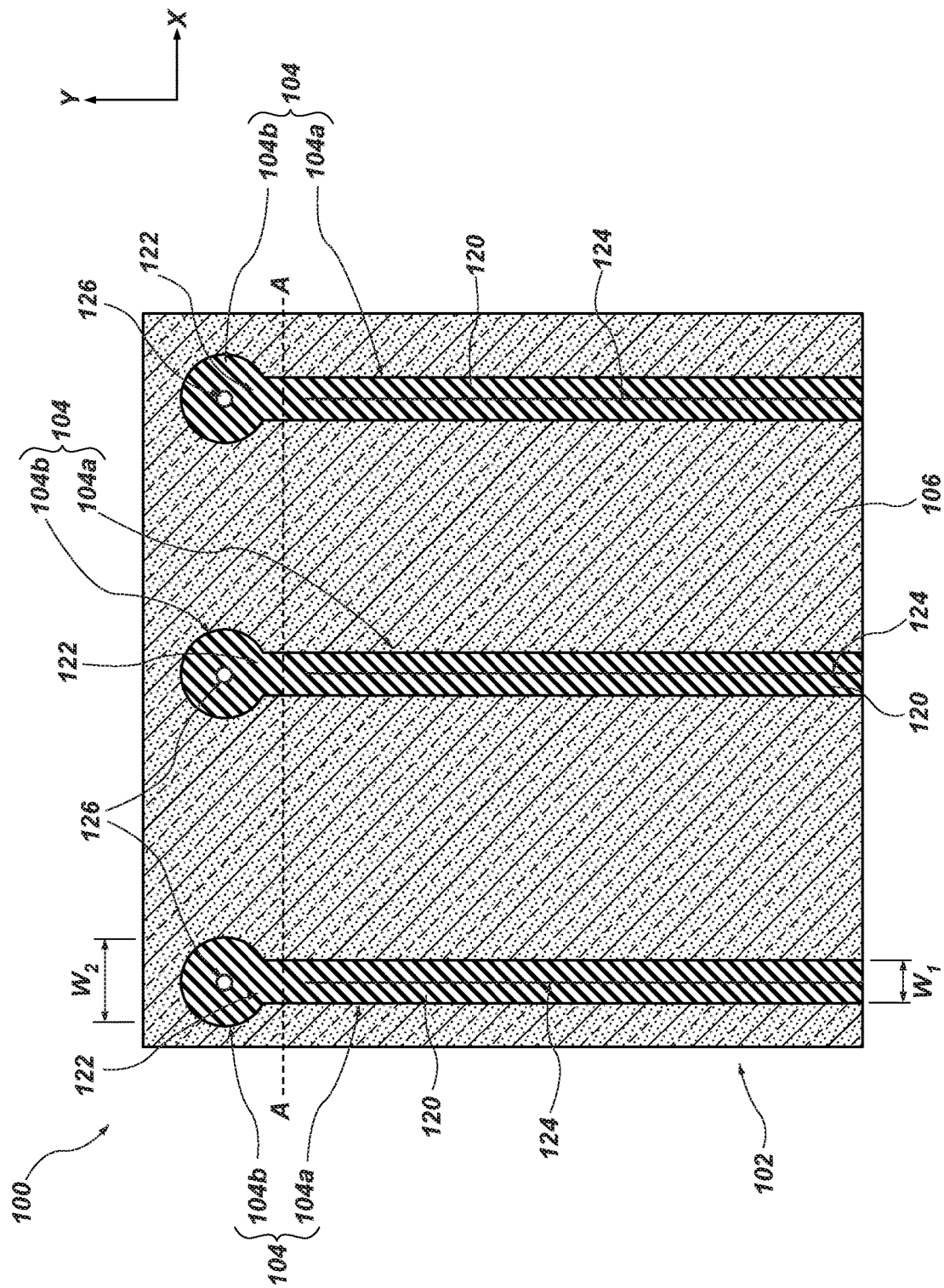
Figure 2B:
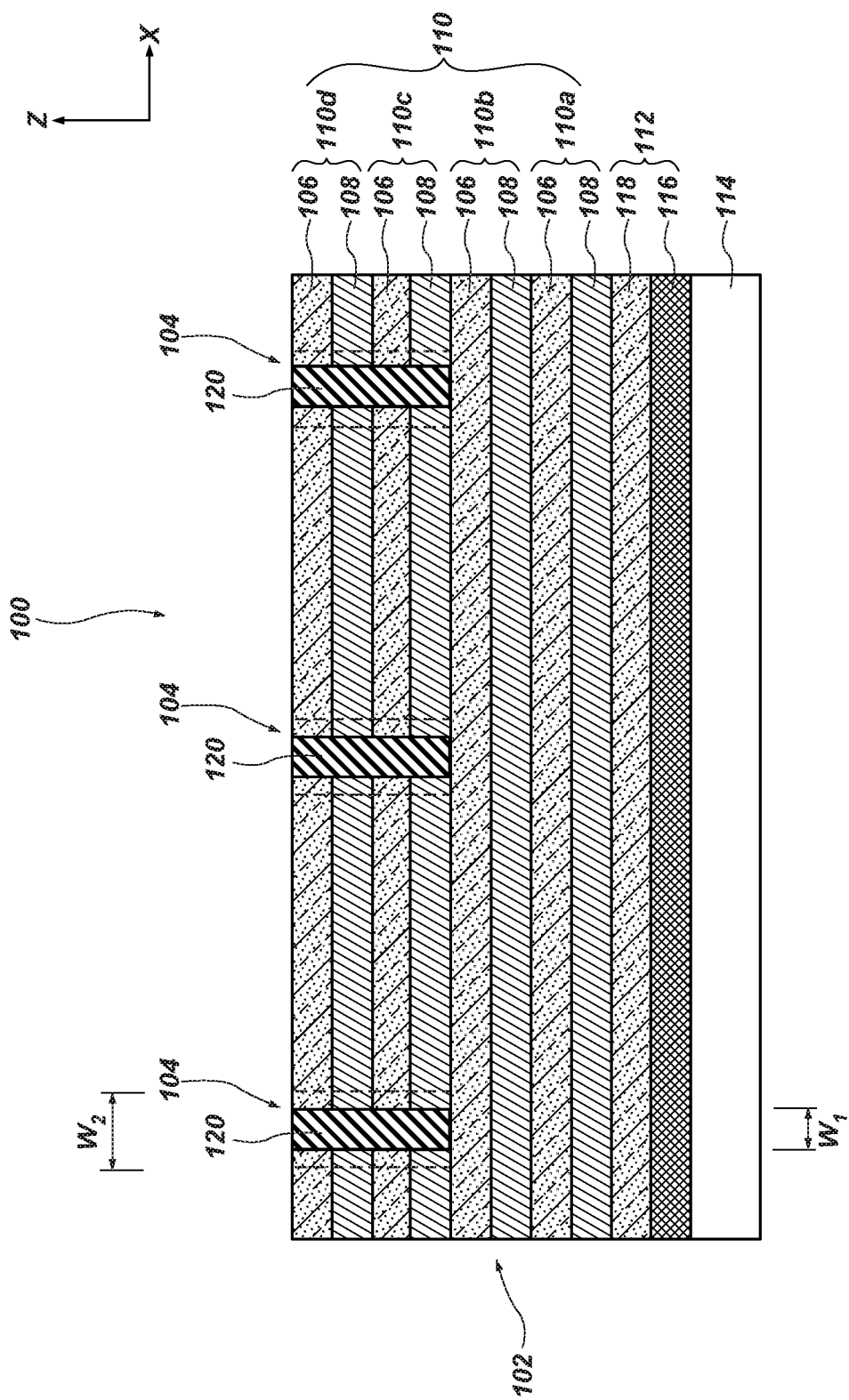

Referring next to FIG. 2A, dielectric structures 120 may be formed within the first trenches 104. The dielectric structures 120 may at least partially fill the first trenches 104, including the relatively narrower portions 104a and the relatively wider portions 104b thereof. FIG. 2B is a simplified partial cross-sectional view of the microelectronic device structure 100 (about the line A-A) at the processing stage shown in FIG. 2A. For clarity and ease of understanding of the drawings and related description, not all features depicted in one of FIGS. 2A and 2B are depicted in the other of FIGS. 2A and 2B.

The dielectric structures 120 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the dielectric structures 120 may substantially the same as a material composition of the insulating structures 106 or the additional insulating structures 108 of the preliminary stack structure 102, or the material composition of the dielectric structures 120 may be different than the material compositions of the insulating structures 106 and the additional insulating structures 108. In some embodiments, a material composition of the dielectric structures 120 is substantially the same as a material composition of the insulating structures 106 of the preliminary stack structure 102. The dielectric structures 120 may include a substantially homogeneous distribution or a substantially heterogeneous distribution of the at least one dielectric material thereof. In some embodiments, each of the dielectric structures 120 exhibits a substantially homogeneous distribution of the dielectric material thereof. In further embodiments, one or more of the dielectric structures 120 exhibits a substantially heterogeneous distribution of dielectric material thereof. In some embodiments, the dielectric structures 120 are formed of and include $SiO_2$.

As shown in FIG. 2A, each of the dielectric structures 120 may include at least one void space 124 (e.g., at least one air gap) therein positioned at or proximate a horizontal centerline (e.g., in the Y-direction) of the relatively narrower portion 104a of the first trench 104 filled by dielectric structure 120, and at least one additional void space 126 therein positioned at or proximate a horizontal center (e.g., in the X-direction and the Y-direction) of the relatively wider portion 104b of the first trench 104 filled by dielectric structure 120. The void space 124 may linearly extend (e.g., substantially continuously linearly extend) along the centerline of the relatively narrower portion 104a of the first trench 104, and the additional void space 126 may be limited to a horizontal area at or proximate the center of the relatively wider portion 104b of the first trench 104. In addition, each of the dielectric structures 120 may individually include a substantially void-free section 122 horizontally interposed between (e.g., in the Y-direction) the void space 124 and the additional void space 126, and substantially (e.g., completely) free of void spaces therein. Put another way, within the horizontally boundaries of the substantially void-free section 122 of the dielectric structure 120, the dielectric material of the dielectric structure 120 may substantially (e.g., completely) fill the first trench 104. Accordingly, the substantially void-free section 122 of the dielectric structure 120 may physically separate and isolate the void space 124 and the additional void space 126 from one another. The cross-sectional shape and horizontal dimensions of the relatively wider portion 104b of the first trench 104 may facilitate the formation of the substantially void-free section 122 of the dielectric structure 120. As shown in FIG. 2A, horizontal extent (e.g., in the Y-direction) of the void space 124 may terminate at or prior to a horizontal boundary (e.g., in the Y-direction) of relatively narrower portion 104a of the first trench 104. For each of the dielectric structures 120, the void space 124 therein may not substantially horizontally extend into the relatively wider portion 104b of the first trench 104 filled by the dielectric structure 120. Preventing the void space 124 from horizontally extending (e.g., in the Y-direction) across an entirety of the dielectric structure 120 may impede (e.g., prevent) one or more conductive materials from undesirably filling the void space 124 during subsequent processing of the microelectronic device structure 100, thereby mitigating performance and reliability problems (e.g., undesirable current leakage and short circuits) for microelectronic device structures and microelectronic devices of the disclosure relative to conventional configurations.

The dielectric structures 120 may be formed using conventional processes (e.g., conventional deposition processes) and conventional processing equipment, which are not described in detail herein. For example, the dielectric structures 120 may be formed within the first trenches 104 using one or more conventional material deposition processes (e.g., a conventional CVD process, a conventional ALD process).

Figure 3:
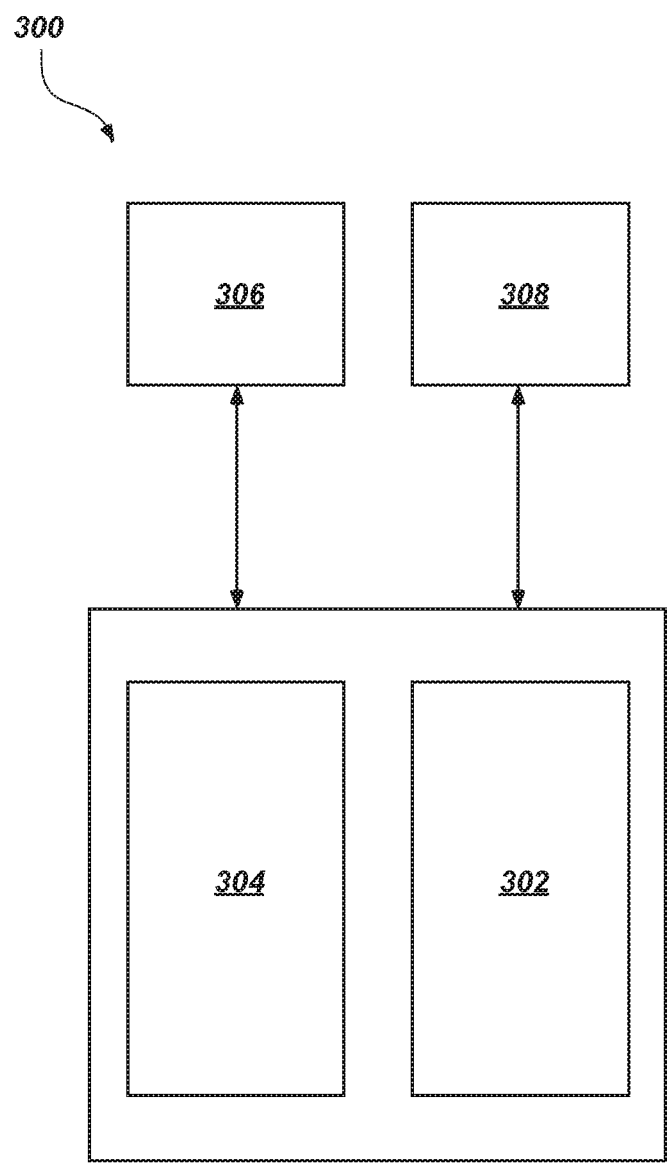
Figure 3A:
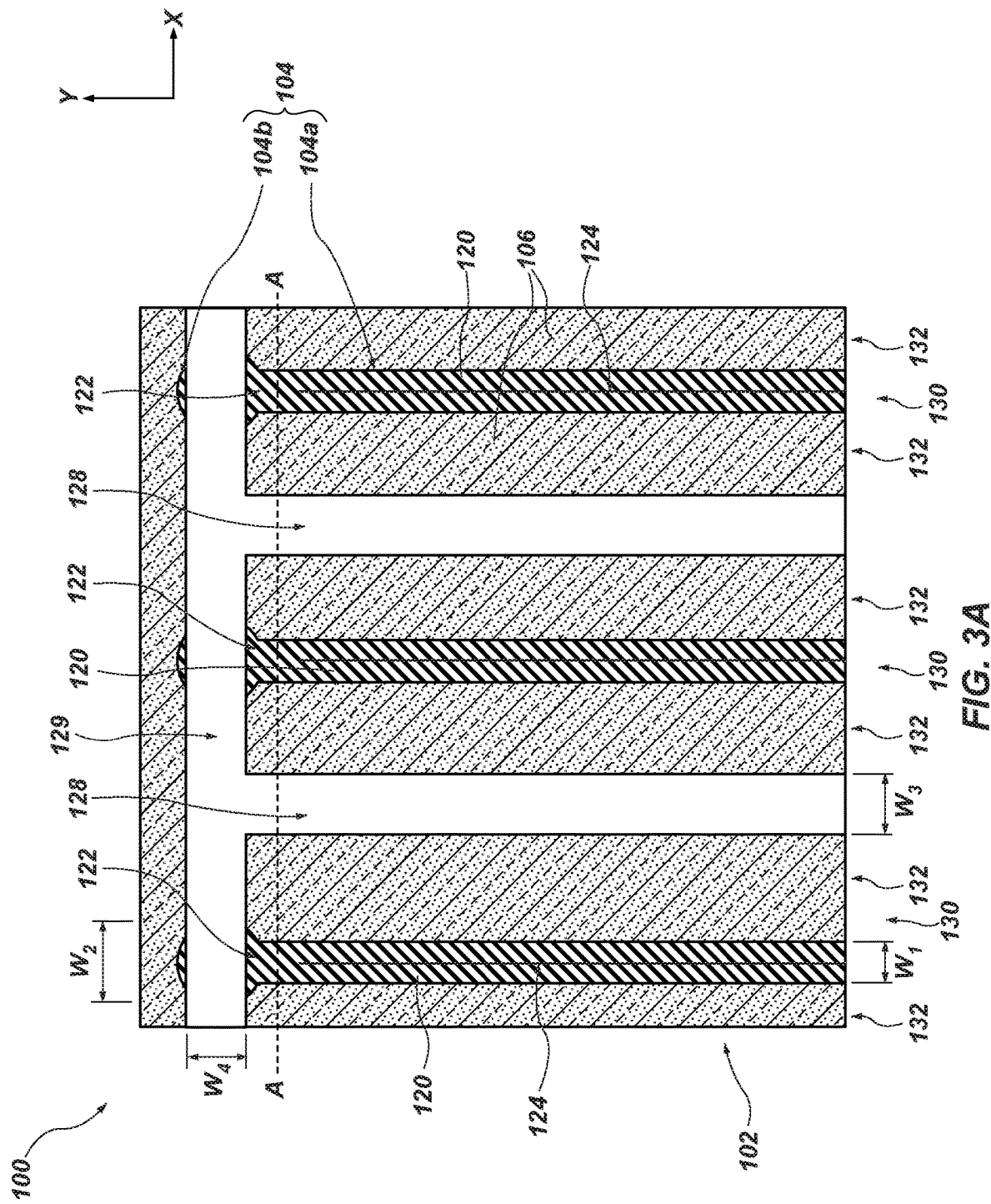
Figure 3B:
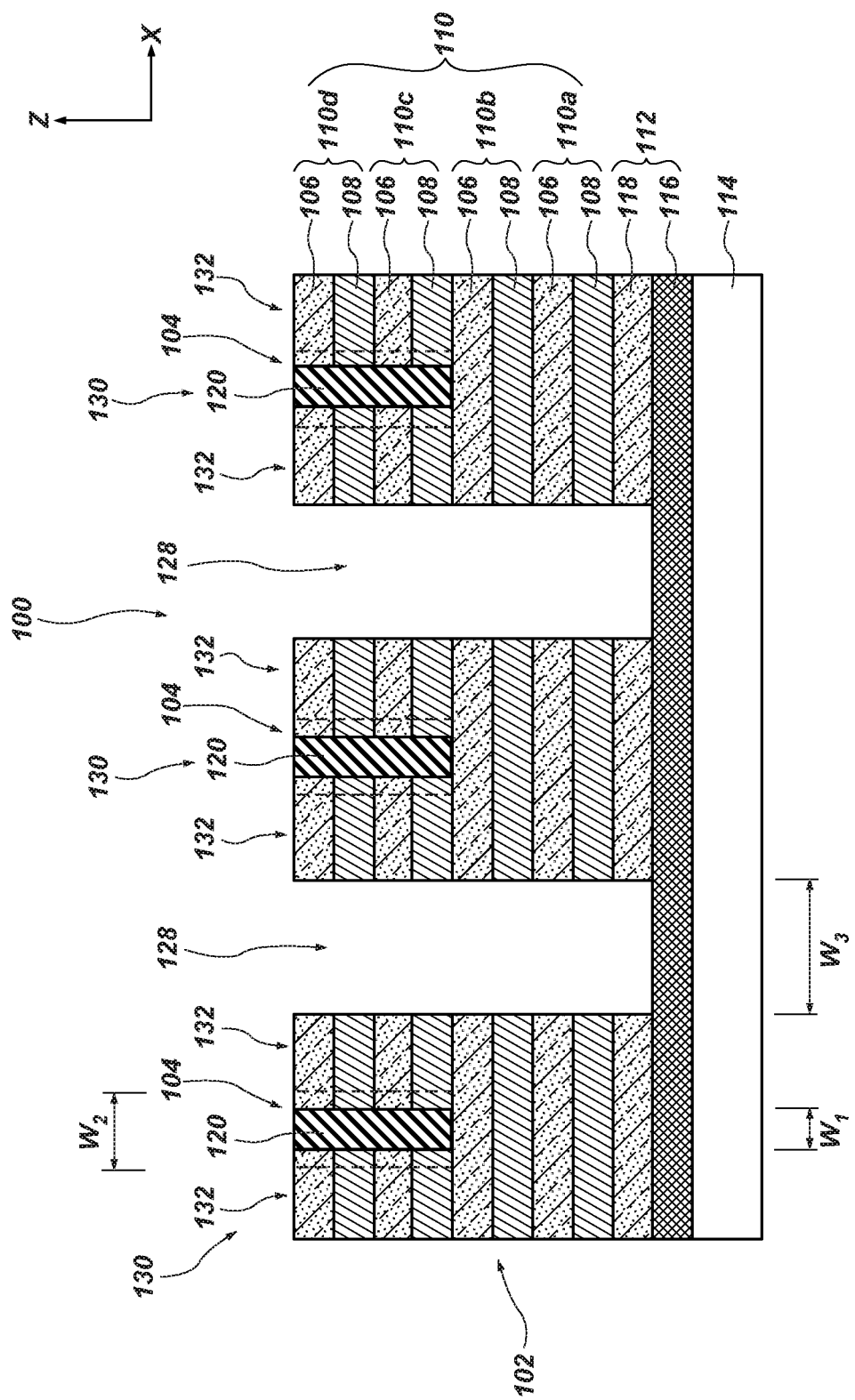

Referring next to FIG. 3A, second trenches 128 (e.g., second slots, second openings) and at least one third trench 129 (e.g., at least one third slot, at least one third opening) may be formed within the preliminary stack structure 102. The second trenches 128 may extend in a first horizontal direction (e.g., the Y-direction), and the third trench 129 may intersect the second trenches 128 and may extend in a second horizontal direction (e.g., the X-direction) orthogonal to the first horizontal direction. The second trenches 128 may horizontally intervene (e.g., in the X-direction) between horizontally-neighboring dielectric structures 120. For example, each of the second trenches 128 may individually horizontally intervene between two (2) of the dielectric structures 120 horizontally neighboring one another. The second trenches 128 may horizontally alternate (e.g., in the X-direction) with the relatively narrower portions 104*a* of the first trenches 104 partially filled with the dielectric structures 120. Horizontally-neighboring second trenches 128 may be adjacent (e.g., may flank) opposing sides a single dielectric structure 120. The third trench 129 may be integral and continuous with ends (e.g., in the Y-direction) of the second trenches 128, and may extend (e.g., in the X-direction) from and between the second trenches 128. The third trench 129 may be horizontally aligned with (e.g., in the Y-direction) and overlap the relatively wider portions 104*b* of the first trenches 104 partially filled with the dielectric structures 120. FIG. 3B is a simplified partial cross-sectional view of the microelectronic device structure 100 (about the line A-A) at the processing stage shown in FIG. 3A. For clarity and ease of understanding of the drawings and related description, not all features depicted in one of FIGS. 3A and 3B are depicted in the other of FIGS. 3A and 3B.

The second trenches 128 may each individually exhibit a third width $W_3$ (e.g., a horizontal dimension in the X-direction), and the third trench 129 may exhibit a fourth width $W_4$. The third width $W_3$ may be substantially the same as (e.g., substantially equal to) the fourth width $W_4$, or the width $W_3$ may be different that (e.g., not equal to) the fourth width $W_4$. In some embodiments, the third width $W_3$ of each of the second trenches 128 is substantially the same as the fourth width $W_4$ of the third trench 129. In addition, the third width $W_3$ of each of the second trenches 128 and the fourth width $W_4$ of the third trench 129 may each individually be less than, equal to, or greater than the second width $W_2$ of each of the relatively wider portions 104*b* of the first trenches 104. As shown in FIG. 3A, in some embodiments, the fourth width $W_4$ of the third trench 129 is less than the second width $W_2$ (e.g., diameter) of each of the relatively wider portions 104*b* of the first trenches 104, such that the third trench 129 is confined in the Y-direction between horizontal boundaries of the relatively wider portions 104*b* of the first trenches 104. In addition, the second trenches 128 and the third trench 129 may each individually exhibit a horizontally elongate 3D shape, such as rectangular prism shape having a substantially rectangular cross-sectional shape.

The second trenches 128 and the third trench 129 may each be formed to vertically extend substantially completely through the preliminary stack structure 102. As shown in FIG. 3B, the second trenches 128 may vertically extend (e.g., in the Z-direction) from a vertically uppermost boundary of a vertically uppermost tier 110 (e.g., the fourth tier 110*d*) of the preliminary stack structure 102 to a vertically lowermost boundary of a vertically lowermost tier 110 (e.g., the first tier 110*a*) of the preliminary stack structure 102. In addition, referring again to FIG. 3A, the third trench 129 may vertically extend completely through the portions of the dielectric structures 120 within the relatively wider portions 104*b* of the first trenches 104 in the preliminary stack structure 102, as well as through the tiers 110 of the preliminary stack structure 102 horizontally around and vertically below the dielectric structures 120.

As shown in FIG. 3A, for each of the dielectric structures 120, the substantially void-free section 122 thereof may be horizontally interposed between (e.g., in the Y-direction) the void space 124 in the dielectric structure 120 and the third trench 129. Accordingly, the substantially void-free section 122 of the dielectric structure 120 may physically separate and isolate the void space 124 from the third trench 129. Put another way, the third trench 129 is horizontally offset (e.g., in the Y-direction) from the void space 124 in the dielectric structure 120, such that the third trench 129 are non-continuous and discrete from one another. Isolating the third trench 129 from the void space 124 of the dielectric structure 120 by way of the substantially void-free section 122 of the dielectric structure 120 may, for example, prevent conductive material from undesirably filling the void space 124 during "replace gate" or "gate last" processing acts to be subsequently performed on the microelectronic device structure 100, as described in further detail below.

With continued reference to FIG. 3A, the second trenches 128 and the third trench 129 may divide the preliminary stack structure 102 into an array of blocks 130. The blocks 130 of the array may each extend in substantially the same horizontal direction (e.g., the Y-direction) as one another, and neighboring blocks 130 of the array may be horizontally separated (e.g., in the X-direction) from one another by the second trenches 128. Each of the blocks 130 of the array may exhibit substantially the same geometric configuration (e.g., dimensions, shape) as each other of the blocks 130 of the array. In addition, each pair of laterally-neighboring blocks 130 of the array may be horizontally separated from one another by substantially the same distance (e.g., corresponding to the third width $W_3$ of each of the second trenches 128) as each other pair of laterally-neighboring blocks 130 of the array. Accordingly, the blocks 130 of the array may be substantially uniformly (e.g., non-variably, equally, consistently) sized, shaped, and spaced relative to one another.

Each of the blocks 130 of the array may individually be sub-divided into two (2) or more sub-blocks 132. As shown in FIG. 3A, in some embodiments, each of the blocks 130 of the array individually includes two (2) sub-blocks 132. For each of the blocks 130 of the array, one of the dielectric structures 120 may horizontally intervene between (e.g., in the X-direction) horizontally-neighboring sub-blocks 132 of the block 130. Each of the sub-blocks 132 of each of the blocks 130 of the array may exhibit substantially the same geometric configuration (e.g., dimensions, shape) as each other of the sub-blocks 132 of each of the blocks 130 of the array. In addition, each pair of laterally-neighboring sub-blocks 132 within each block 130 of the array may be horizontally separated from one another by substantially the same distance(s) (e.g., a distance corresponding to the first width $W_1$ of the relatively narrower portion 104*a* of each of the first trenches 104) as each other pair of laterally-neighboring sub-blocks 132 within each other block 130 of the array. As depicted in FIG. 3A, in some embodiments, distances between laterally-neighboring sub-blocks 132 of each individual block 130 of the array are greater at locations relatively more horizontally proximate to (e.g., in the Y-direction) the third trench 129 than at other locations relatively more horizontally distal from (e.g., in the Y-direction) the third trench 129. For example, for each individual block 130 of the array, remaining sections (if any) of the relatively wider portions 104*b* of the first trenches 104 (as well as remaining portions (if any) of the dielectric structures 120 therein) may increase the separation between portions of the laterally-neighboring sub-blocks 132 more horizontally proximate to the third trenches 129 relative to other portions of the laterally-neighboring sub-blocks 132 more horizontally distal from the third trenches 129.

The second trenches 128 and the third trench 129 may be formed using conventional material removal (e.g., masking and etching) processes, which are not described in detail herein. For example, at least one etching process (e.g., at least one dry etching process, such as one or more of a RIE process, a deep RIE process, a plasma etching process, a reactive ion beam etching process, and a chemically assisted ion beam etching process; at least one wet etching process, such as one or more of a hydrofluoric acid etching process, a buffered hydrofluoric acid etching process, and a buffered oxide etching process) may be employed to form the second trenches 128 and the third trench 129.

Figure 4A:
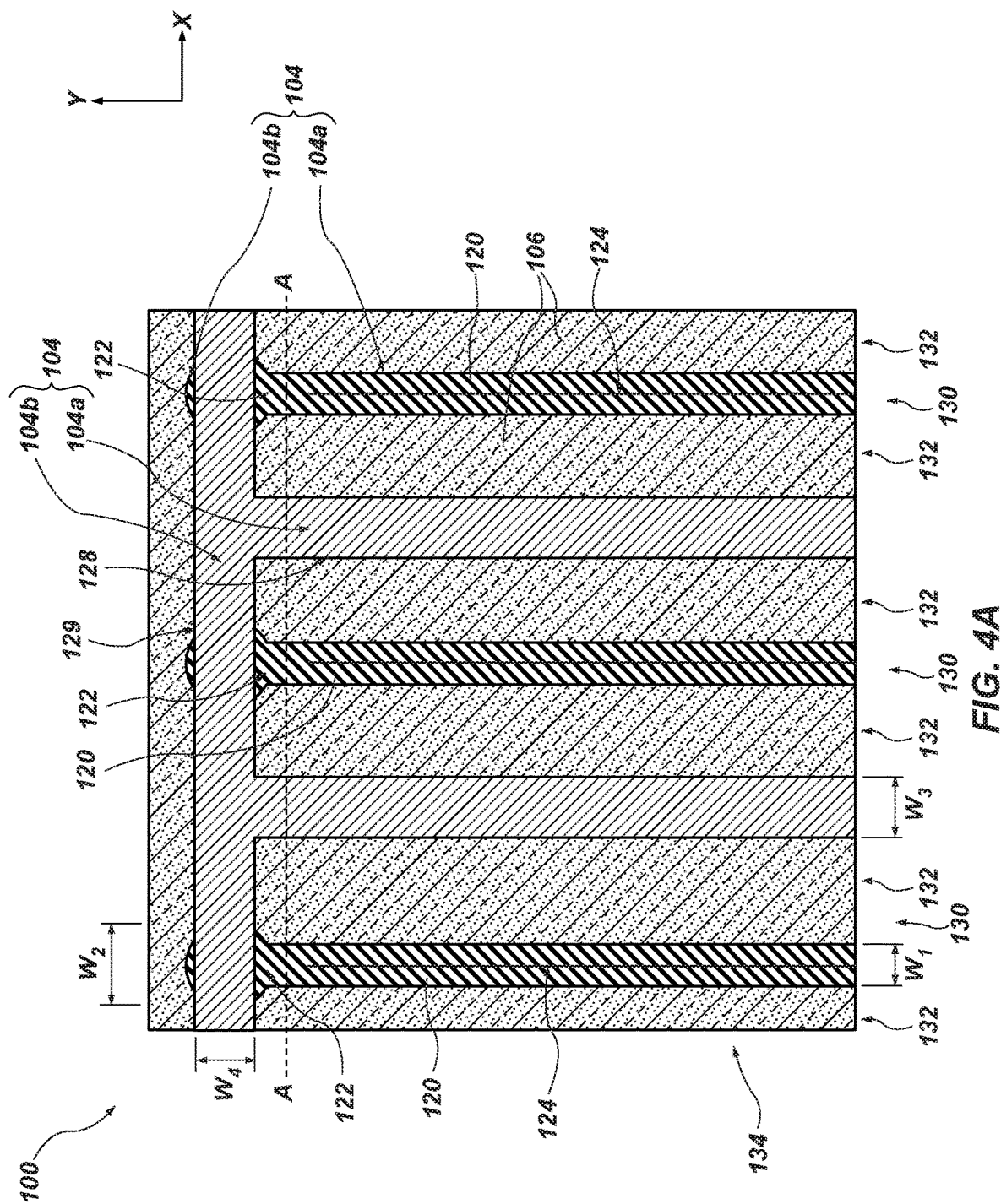
Figure 4B:
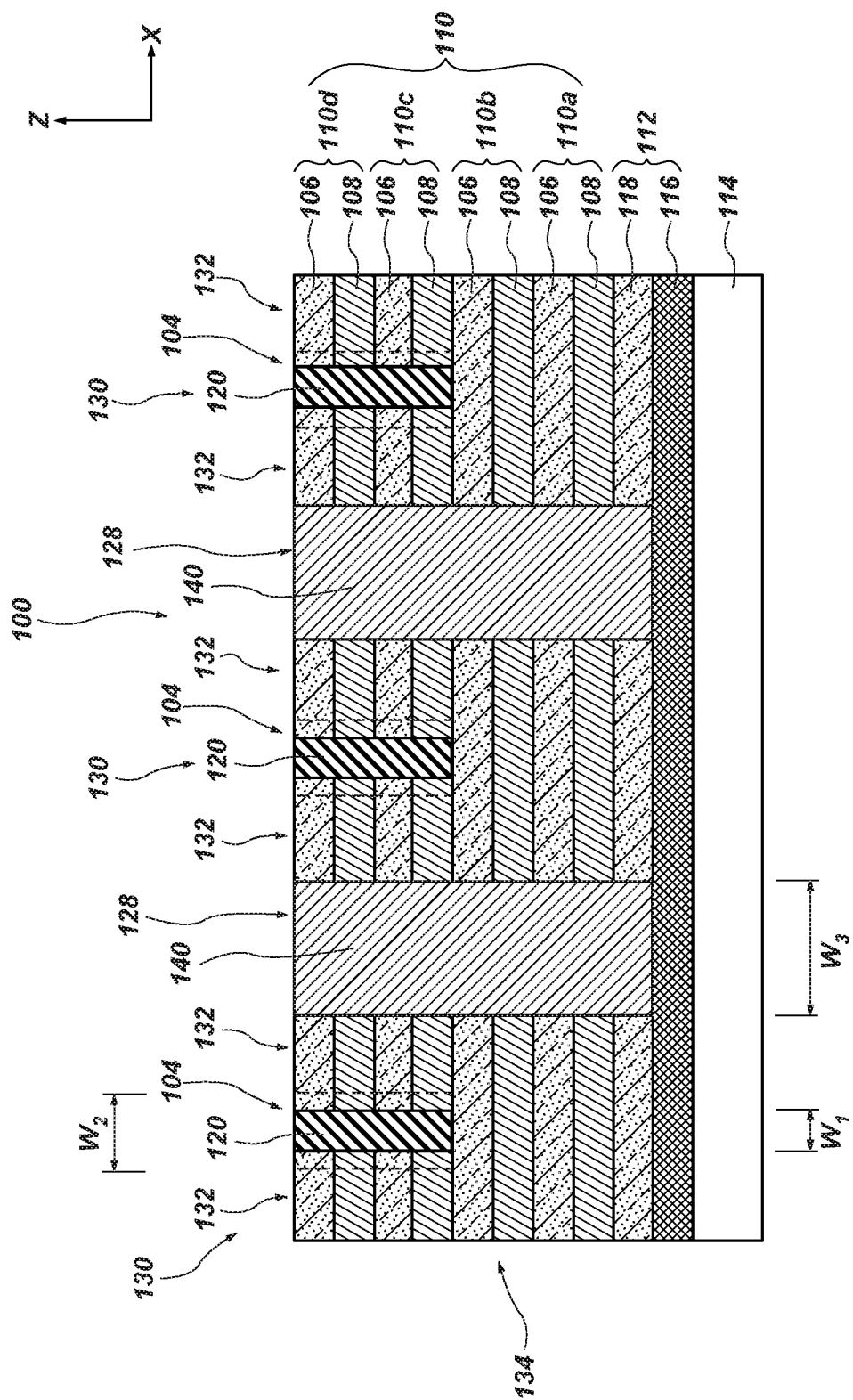

Referring next to FIG. 4A, the microelectronic device structure 100 at the processing stage depicted in FIGS. 3A and 3B may be subjected to a "replace gate" or "gate last" process to convert the preliminary stack structure 102 (FIGS. 3A and 3B) into a conductive stack structure 134, and then the second trenches 128 and the third trench 129 may be at least partially (e.g., substantially) filled with at least one additional dielectric structure 140. FIG. 4B is a simplified partial cross-sectional view of the microelectronic device structure 100 (about the line A-A) at the processing stage shown in FIG. 4A. For clarity and ease of understanding of the drawings and related description, not all features depicted in one of FIGS. 4A and 4B are depicted in the other of FIGS. 4A and 4B.

Referring to FIG. 4B, the replace gate process may include selectively removing one or more portions of the additional insulating structures 108 (FIG. 3B) of the tiers 110 (FIG. 3B) of the preliminary stack structure 102 (FIG. 3B) exposed by the second trenches 128 and the third trench 129, and then filling spaces previously occupied by the additional insulating structures 108 with at least one conductive material to form conductive structures 138. During the formation of the conductive structures 138, the substantially void-free sections 122 of the dielectric structures 120 impedes (e.g., prevents) the conductive material from filling the void spaces 124 in the dielectric structures 120, such mitigate the risk of undesirable current leakage and short circuits during use and operation of a microelectronic device (e.g., a memory device, such as a 3D NAND Flash memory device) including the microelectronic device structure 100. As shown in FIG. 4B, the conductive stack structure 134 may be formed to include a vertically alternating (e.g., in the Z-direction) sequence of the insulating structures 106 and the conductive structures 138 arranged in conductive tiers 136. A quantity of the conductive tiers 136 in the conductive stack structure 134 may correspond to (e.g., be the same as) the quantity of the tiers 110 (FIG. 3B) included in the preliminary stack structure 102 (FIG. 3B). Each of the conductive tiers 136 of the conductive stack structure 134 may include an insulating structure 106 and a conductive structure 138 vertically adjacent the insulating structure 106.

With returned reference to FIG. 4B, the conductive structures 138 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the conductive structures 138 are formed of and include W. Each of the conductive structures 138 may individually include a substantially homogeneous distribution of the at least one conductive material, or a substantially heterogeneous distribution of the at least one conductive material. In some embodiments, each of the conductive structures 138 exhibits a substantially homogeneous distribution of conductive material. In additional embodiments, at least one of the conductive structures 138 exhibits a substantially heterogeneous distribution of at least one conductive material.

The conductive structures 138 of one or more vertically upper conductive tiers of the conductive stack structure 134 may be employed as select gate structures (e.g., drain side select gate (SGD) structures) for the blocks 130 of the array. In addition, the conductive structures 138 of one or more vertically lower conductive tiers of the conductive stack structure 134 may be employed as additional select gate structures (e.g., source side select gate (SGS) structures) for the blocks 130 of the array. The conductive structures 138 of one or more remaining conductive tiers 136 of the conductive stack structure 134 may be employed as access line (e.g., word line) structures (e.g., access line plates, word line plates) for the blocks 130 of the array.

The additional insulating structures 108 (FIG. 3B) of the tiers 110 (FIG. 3B) of the preliminary stack structure 102 (FIG. 3B) may be selectively removed by subjecting the preliminary stack structure 102 to at least one etching process (e.g., an isotropic etching process) employing an etch chemistry in which the additional dielectric material of the additional insulating structures 108 (FIG. 3B) is selectively removed relative to the dielectric material of the insulating structures 106. By way of non-limiting example, if the insulating structures 106 are formed of and include $SiO_2$, and the additional insulating structures 108 are formed of and include $Si_3N_4$, the preliminary stack structure 102 may be exposed to an etchant comprising phosphoric acid ($H_3PO_4$) to selectively remove one or more portions of the additional insulating structures 108 adjacent side surfaces the blocks 130 of the array exposed by the second trenches 128 and the third trench 129. Thereafter, the conductive material may be formed (e.g., delivered, deposited) within void spaces resulting from the selective removal of the additional dielectric material of the additional insulating structures 108 (FIG. 3B) to form the conductive structures 138.

With returned reference to FIG. 4A, the additional dielectric structure 140 may include first portions 140a at least partially (e.g., substantially) filling the second trenches 128, and at least one second portion 140b at least partially (e.g., substantially) filling the third trench 129. The first portions 140a of the additional dielectric structure 140 may extend in a first horizontal direction (e.g., the Y-direction), and the second portion 140b of the additional dielectric structure 140 may intersect the first portions 140a of the additional dielectric structure 140 and may extend in a second horizontal direction (e.g., the X-direction) orthogonal to the first horizontal direction. The first portions 140a of the additional dielectric structure 140 may horizontally intervene (e.g., in the X-direction) between horizontally-neighboring dielectric structures 120. The first portions 140a of the additional dielectric structure 140 may horizontally alternate (e.g., in the X-direction) with the relatively narrower portions 104a of the first trenches 104 partially filled with the dielectric structures 120. The second portion 140b of the additional dielectric structure 140 may be integral and continuous with ends (e.g., in the Y-direction) of the first portions 140a of the additional dielectric structure 140, and may extend (e.g., in the X-direction) from and between the first portions 140a of the additional dielectric structure 140. The second portion 140b of the additional dielectric structure 140 may be horizontally aligned with (e.g., in the Y-direction) and overlap the relatively wider portions 104b of the first trenches 104 filled with the dielectric structures 120.

The additional dielectric structure 140 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the additional dielectric structure 140 may substantially the same as a material composition of one or more of the dielectric structures 120 and the insulating structures 106 of the conductive stack structure 134, or the material composition of the additional dielectric structure 140 may be different than the material compositions of the dielectric structures 120 and the insulating structures 106 of the conductive stack structure 134. In some embodiments, a material composition of the additional dielectric structure 140 is substantially the same as a material composition of the dielectric structures 120 and a material composition of the insulating structures 106 of the conductive stack structure 134. The additional dielectric structure 140 may include a substantially homogeneous distribution or a substantially heterogeneous distribution of the at least one dielectric material thereof. In some embodiments, additional dielectric structure 140 exhibits a substantially homogeneous distribution of the dielectric material thereof. In further embodiments, the additional dielectric structure 140 exhibits a substantially heterogeneous distribution of dielectric material thereof. In some embodiments, the additional dielectric structure 140 is formed of and includes $SiO_2$.

The additional dielectric structure 140 may be formed using conventional processes (e.g., conventional deposition processes) and conventional processing equipment, which are not described in detail herein. For example, the additional dielectric structure 140 may be formed within the second trenches 128 and the third trench 129 using one or more conventional material deposition processes (e.g., a conventional CVD process, a conventional ALD process).

Thus, in accordance with embodiments of the disclosure, a method of forming a microelectronic device comprises forming a stack structure comprising vertically alternating insulating structures and additional insulating structures arranged in tiers. Each of the tiers individually comprises one of the insulating structures and one of the additional insulating structures. A first trench is formed to partially vertically extend through the stack structure. The first trench comprises a first portion having a first width, and a second portion at a horizontal boundary of the first portion and having a second width greater than the first width. A dielectric structure is formed within the first trench. The dielectric structure comprises a substantially void-free section proximate the horizontal boundary of the first portion of the trench.

Microelectronic device structures (e.g., the microelectronic device structure 100 previously described with reference to FIGS. 4A and 4B) in accordance with embodiments of the disclosure may be included in embodiments of microelectronic devices of the disclosure. For example, FIG. 5 illustrates a partial cutaway perspective view of a portion of a microelectronic device 200 (e.g., a memory device, such as a 3D NAND Flash memory device), in accordance with embodiments of the disclosure.

Figure 5:
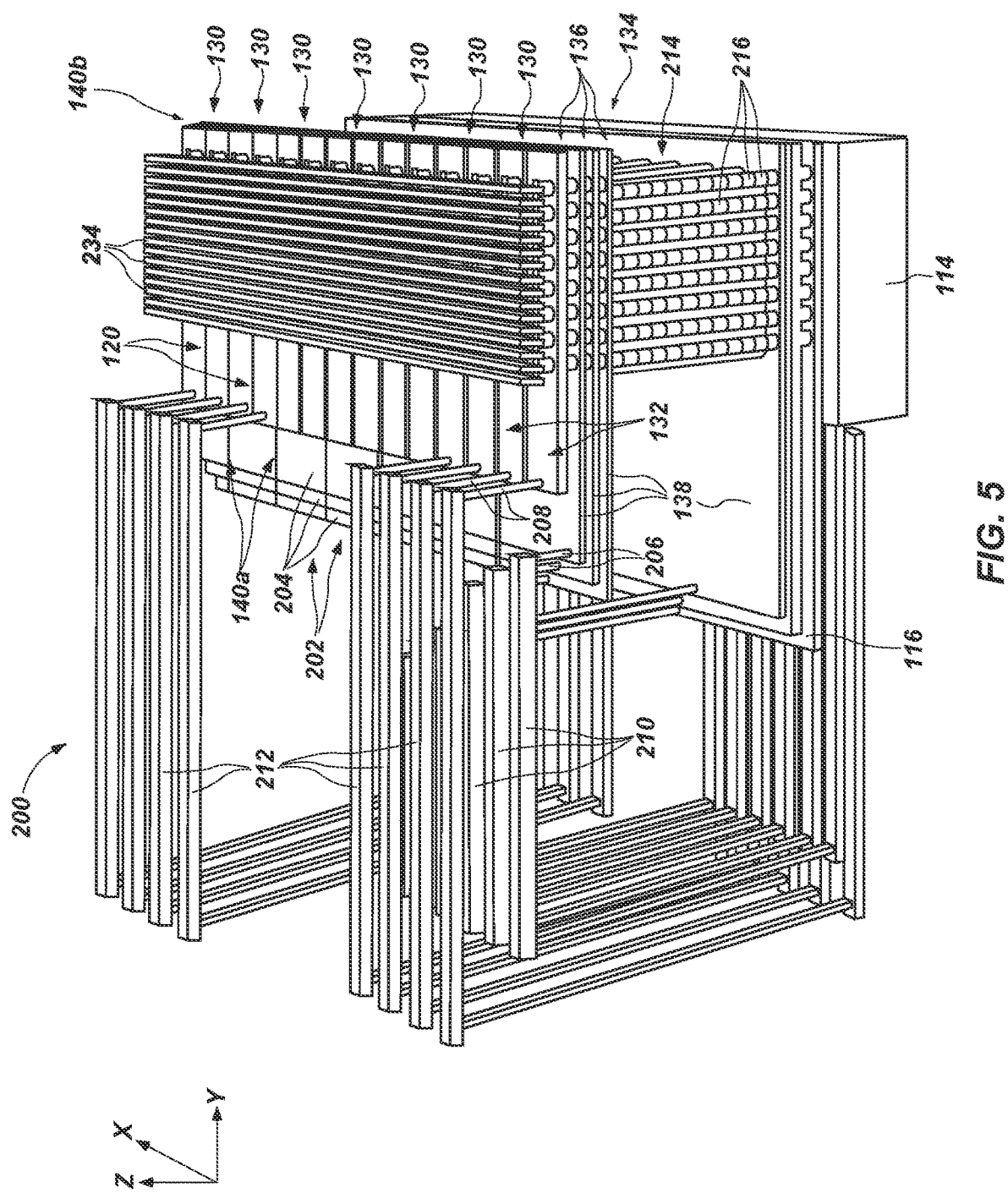
FIG. 5 is a partial cutaway perspective view of a microelectronic device, in accordance with an embodiment of the disclosure.

As shown in FIG. 5, the microelectronic device 200 includes the microelectronic device structure 100 (including the various components thereof) previously described with reference to FIGS. 4A and 4B. The microelectronic device 200 further includes staircase structures 202 at horizontal ends (e.g., in the Y-direction) of the conductive stack structure 134. Each of the blocks 130 of the conductive stack structure 134 may individually include a staircase structure 202 having steps 204 at least partially defined by horizontal ends (e.g., edges) of the conductive tiers 136. The steps 204 of the staircase structures 202 may serve as contact regions to electrically couple the conductive structures 138 of the conductive tiers 136 to one or more other structures of the microelectronic device 200.

The microelectronic device 200 may also include access line contacts 206 (e.g., vertical word line contact structures) and select gate contacts 208 physically and electrically contacting the steps 204 of the staircase structures 202 to provide electrical access to the conductive structures 138 of the conductive tiers 136 of the conductive stack structure 134. The access line contacts 206 and the select gate contacts 208 may each individually be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe).

In addition, the microelectronic device 200 may include access lines 210 (e.g., word lines), select lines 212, and digit lines 234 (e.g., data lines, bit lines). The access lines 210 may electrically couple some of the conductive structures 138 (e.g., conductive structures 138 employed as access line plates) and the control device 114. The select lines 212 may electrically couple other of the conductive structures 138 (e.g., conductive structures 138 employed as select gate structures, such as SGD structures and SGS structures) and the control device 114. The digit lines 234 may overly the conductive stack structure 134, and may be electrically coupled to the control device 114. The access lines 210, the select lines 212, and the digit lines 234 may each individually be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe).

As shown in FIG. 5, the microelectronic device 200 may further include strings 214 of memory cells 216 vertically coupled to each other in series. The strings 214 of memory cells 216 may vertically extend through the conductive stack structure 134. Each of the strings 214 of memory cells 216 may include a vertically-extending pillar structure including semiconductive pillar (e.g., a polysilicon pillar, a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the vertically-extending pillar structure and the conductive structures 138 of the conductive tiers 136 of the conductive stack structure 134 may define the memory cells 216 of the string 214. In some embodiments, the memory cells 216 comprise so-called "MONOS" (metal-oxide-nitride-oxide-semiconductor) memory cells. In additional embodiments, the memory cells 216 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 216 comprise so-called "floating gate" memory cells including floating gates (e.g., metallic floating gates) as charge storage structures. The floating gates may horizontally intervene between central structures of the vertically-extending pillar structures and the conductive structures 138 of the different conductive tiers 136 of the conductive stack structure 134. The strings 214 of memory cells 216 may be electrically coupled to and may vertically extend between the digit lines 234 and the source structure 116. As shown in FIG. 5, the control device 114 may vertically underlie (e.g., in the Z-direction) and may be at least partially positioned within horizontal boundaries of a region of the conductive stack structure 134 containing the strings 214 of memory cells 216.

Thus, in accordance with embodiments of the disclosure, a microelectronic device comprises a stack structure comprising vertically alternating insulating structures and conductive structures arranged in tiers, each of the tiers individually comprising one of the insulating structures and one of the conductive structures; first filled trenches partially vertically extending through the stack structure and horizontally extending in a first direction; second filled trenches substantially vertically extending through the stack structure and horizontally alternating with the first filled trenches in a second direction orthogonal to the first direction; a third filled trench substantially vertically extending through the stack structure and horizontally extending in the second direction, the third filled trench intersecting the first filled trenches and the second filled trenches; at least one dielectric structure within the second filled trenches and the third filled trenches; and additional dielectric structures within the first filled trenches, each of the additional dielectric structures individually comprising a substantially void-free section directly horizontally adjacent portions of the at least one dielectric structure within the third filled trenches.

Figure 6:
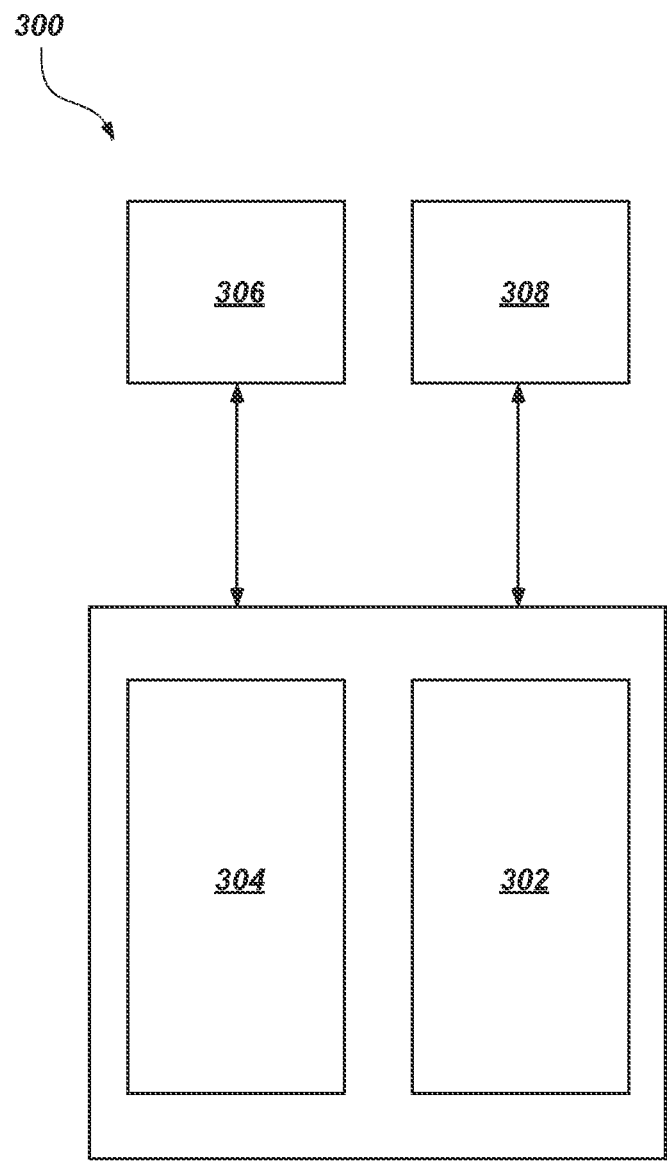
FIG. 6 is a schematic block diagram illustrating an electronic system, in accordance with embodiments of the disclosure.

Microelectronic devices (e.g., the microelectronic device 200 shown in FIG. 5) including microelectronic device structures (e.g., the microelectronic device structure 100 shown in FIGS. 4A and 4B) in accordance with embodiments of the disclosure may be used in embodiments of electronic systems of the disclosure. For example, FIG. 6 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of a microelectronic device (e.g., the microelectronic device 200 shown in FIG. 5) previously described herein. The electronic system 300 may further include at least one electronic signal processor device 304 (often referred to as a "microprocessor"). The electronic signal processor device 304 may, optionally, include an embodiment of a microelectronic device (e.g., the microelectronic device 200 shown in FIG. 5) previously described herein. While the memory device 302 and the electronic signal processor device 304 are depicted as two (2) separate devices in FIG. 6, in additional embodiments, a single (e.g., only one) memory/processor device having the functionalities of the memory device 302 and the electronic signal processor device 304 is included in the electronic system 300. In such embodiments, the memory/processor device may include an embodiment of a microelectronic device structure (e.g., the microelectronic device structure 100 shown in FIGS. 4A and 4B) previously described herein, and/or an embodiment of a microelectronic device (e.g., the microelectronic device 200 shown in FIG. 5) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising a stack structure comprising tiers each comprising an electrically conductive structure and a dielectric structure vertically neighboring the electrically conductive structure; at least one filled trench partially extending through the stack structure; at least two additional filled trenches substantially extending through the stack structure and adjacent (e.g., flanking) opposing sides of the at least one filled trench; at least one other filled trench substantially vertically extending through the stack structure and intersecting the at least one filled trench and the at least two additional filled trenches; at least one dielectric structure within the at least two additional filled trenches and the at least one other filled trench; and at least one additional dielectric structure within the at least one filled trench and comprising a substantially void-free section horizontally adjacent portions of the at least one dielectric structure within the at least one other filled trench.

The methods and structures of the disclosure may substantially alleviate problems related to the formation and processing of conventional microelectronic device structures including conductive stack structures. The structures (e.g., the microelectronic device structure 100), devices (e.g., the microelectronic device 200), and systems (e.g., the electronic system 300) of the disclosure advantageously facilitate one or more of improved performance, reliability, and durability, lower costs, increased miniaturization of components, improved pattern quality, and greater packaging density as compared to conventional structures, conventional devices, and conventional systems. By way of non-limiting example, the methods and structural configurations (e.g., the configuration of the microelectronic device structure 100 previously described with reference to FIGS. 4A and 4B) may reduce the risk of undesirable source-WL current leakage and short circuits as compared to conventional methods and configurations.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
   a stack structure comprising vertically alternating insulating structures and conductive structures arranged in tiers, each of the tiers individually comprising one of the insulating structures and one of the conductive structures;
   first filled trenches partially vertically extending through the stack structure and horizontally extending in a first direction;
   second filled trenches substantially vertically extending through the stack structure and horizontally alternating with the first filled trenches in a second direction orthogonal to the first direction;
   a third filled trench substantially vertically extending through the stack structure and horizontally extending in the second direction, the third filled trench intersecting the first filled trenches and the second filled trenches;
   at least one dielectric structure within the second filled trenches and the third filled trenches; and
   additional dielectric structures within the first filled trenches, each of the additional dielectric structures individually comprising a substantially void-free section directly horizontally adjacent portions of the at least one dielectric structure within the third filled trenches.

2. The microelectronic device of claim 1, wherein each of the first filled trenches comprises:
   a first portion substantially linearly extending in the first direction and having a first width in the second direction; and
   a second portion at a horizontal boundary of the first portion in the first direction and exhibiting a second width in the second direction greater than the first width, the third filled trench intersecting the second portion of each of the first filled trenches.

3. The microelectronic device of claim 2, wherein at least one of the additional dielectric structures within at least one of the first filled trenches further comprises an additional section horizontally adjacent the substantially void-free section thereof and comprising at least one void space therein extending in the first direction across the first portion of the at least one of the first filled trenches.

4. The microelectronic device of claim 1, further comprising:
   staircase structures having steps comprising horizontal ends of the tiers of the stack structure;
   conductive contacts on at least some of the steps of the staircase structures;
   conductive lines electrically coupled to the conductive contacts;
   additional conductive lines overlying the stack structure;
   a source structure underlying the stack structure;
   strings of memory cells vertically extending through the stack structure and electrically coupled to the additional conductive lines and the source structure; and
   a control device electrically coupled to the conductive lines, the additional conductive lines, and the source structure.

5. The microelectronic device of claim 4, wherein the control device comprises CMOS circuitry and is at least partially positioned within horizontal boundaries of and vertically below a region of the stack structure containing the strings of memory cells.

6. The microelectronic device of claim 1, wherein the second filled trenches horizontally intervene between blocks of the stack structure.

7. The microelectronic device of claim 6, wherein the first filled trenches horizontally intervene between sub-blocks of the blocks of the stack structure.

8. The microelectronic device of claim 6, wherein each of the first filled trenches individually horizontally intervenes between horizontally-neighboring select gates of one of the blocks of the stack structure.

9. The microelectronic device of claim 6, wherein the third filled trench is adjacent horizontal ends of the blocks of the stack structure.

10. An electronic system, comprising:
    an input device;
    an output device;
    a processor device operably coupled to the input device and the output device; and
    a memory device operably coupled to the processor device and comprising at least one microelectronic device structure comprising:
       a stack structure comprising tiers each comprising an electrically conductive structure and a dielectric structure vertically neighboring the electrically conductive structure;
       at least one filled trench partially extending through the stack structure;
       at least two additional filled trenches substantially extending through the stack structure and adjacent opposing sides of the at least one filled trench;
       at least one other filled trench substantially vertically extending through the stack structure and intersecting the at least one filled trench and the at least two additional filled trenches;
       at least one dielectric structure within the at least two additional filled trenches and the at least one other filled trench; and
       at least one additional dielectric structure within the at least one filled trench and comprising a substantially void-free section horizontally adjacent portions of the at least one dielectric structure within the at least one other filled trench.

11. The electronic system of claim 10, wherein the memory device comprises a 3D NAND Flash memory device.

* * * * *

UNITED STATES PATENT AND TRADEMARK OFFICE
CERTIFICATE OF CORRECTION

PATENT NO. : 11,043,412 B2  
APPLICATION NO. : 16/532035  
DATED : June 22, 2021  
INVENTOR(S) : Anilkumar Chandolu et al.

Page 1 of 1

It is certified that error appears in the above-identified patent and that said Letters Patent is hereby corrected as shown below:

In the Specification

| | | |
|---|---|---|
| Column 3, | Line 11, | change "herein, vertically-neighboring"" to --herein, "vertically-neighboring"-- |
| Column 3, | Line 14, | change "vertically" to --(e.g., vertically-- |
| Column 7, | Line 63, | change "(Vat')" to --($V_{dd}$)-- |
| Column 9, | Line 24, | change "(ME)" to --(RIE)-- |
| Column 9, | Line 25, | change "ME" to --RIE-- |

Signed and Sealed this  
Tenth Day of August, 2021

Drew Hirshfeld  
*Performing the Functions and Duties of the*  
*Under Secretary of Commerce for Intellectual Property and*  
*Director of the United States Patent and Trademark Office*